United States Patent [19]
Pasch

[11] Patent Number: 6,117,795
[45] Date of Patent: Sep. 12, 2000

[54] USE OF CORROSION INHIBITING COMPOUNDS IN POST-ETCH CLEANING PROCESSES OF AN INTEGRATED CIRCUIT

[75] Inventor: Nicholas F. Pasch, Pacifica, Calif.

[73] Assignee: LSI Logic Corporation, Milpitas, Calif.

[21] Appl. No.: 09/022,588

[22] Filed: Feb. 12, 1998

[51] Int. Cl.⁷ .......................... H01L 21/00; H01L 21/306
[52] U.S. Cl. ................. 438/745; 216/2; 252/79.1
[58] Field of Search .......................... 216/12, 2; 437/357, 437/360, 434.2; 438/745, 963; 252/79.1

[56] References Cited

U.S. PATENT DOCUMENTS

| | | | |
|---|---|---|---|
| 3,816,185 | 6/1974 | Toledo et al. | 148/6.24 |
| 3,868,217 | 2/1975 | Hollingshad | 21/2.7 |
| 4,343,660 | 8/1982 | Martin | 427/117 |
| 4,497,713 | 2/1985 | Geiger | 210/699 |
| 4,649,025 | 3/1987 | Hwa et al. | 422/15 |
| 4,663,053 | 5/1987 | Geiger | 210/699 |
| 4,692,317 | 9/1987 | Greaves | 422/15 |
| 5,017,029 | 5/1991 | Andou et al. | 400/237 |
| 5,200,031 | 4/1993 | Latchford et al. | 156/659.1 |
| 5,221,424 | 6/1993 | Rhoades | 156/656 |
| 5,453,401 | 9/1995 | Grivna et al. | 437/194 |
| 5,482,566 | 1/1996 | Lee | 134/42 |
| 5,496,491 | 3/1996 | Ward et al. | 510/176 |
| 5,533,635 | 7/1996 | Man | 216/67 |
| 5,607,718 | 3/1997 | Sasaki et al. | 427/97 |
| 5,637,185 | 6/1997 | Murarka et al. | 438/5 |
| 5,650,356 | 7/1997 | Grivna et al. | 437/194 |
| 5,664,989 | 9/1997 | Nakata et al. | 451/41 |
| 5,735,963 | 4/1998 | Obeng | 134/3 |

*Primary Examiner*—Benjamin L. Utech
*Assistant Examiner*—Lynette T. Umez-Eronini
*Attorney, Agent, or Firm*—Beyer Weaver & Thomas

[57] ABSTRACT

A corrosion inhibiting cleaning process for removing etch-residue from an integrated circuit substrate is described. The corrosion inhibiting cleaning process includes: (1) obtaining an integrated circuit substrate that has undergone etching; and (2) cleaning the integrated circuit substrate using a post-etch cleaning solution including a corrosion inhibiting agent in a sufficient concentration to effectively inhibit corrosion of the integrated circuit substrate.

16 Claims, 2 Drawing Sheets

6,117,795

USE OF CORROSION INHIBITING COMPOUNDS IN POST-ETCH CLEANING PROCESSES OF AN INTEGRATED CIRCUIT

CROSS REFERENCE TO RELATED APPLICATIONS

This application is related to U.S. Pat. application No. 08/918,360 filed on Aug. 26, 1997, naming Nicholas Pasch as inventor, and titled "USE OF CORROSION INHIBITING COMPOUNDS TO INHIBIT CORROSION OF METAL PLUGS IN CHEMICAL-MECHANICAL POLISHING."

BACKGROUND OF THE INVENTION

The present invention relates to inhibiting corrosion in an integrated circuit (IC), which corrosion may occur during and after the post-etch cleaning process of the integrated circuit (IC). More particularly, the present invention relates to using a corrosion inhibiting compound, such as an azole compound, during post-etch cleaning to effectively inhibit corrosion of metal plugs, contact holes or vias of an IC.

FIG. 1 shows a partially fabricated IC 10 that may undergo corrosion during or after post-etch cleaning processes. Some significant steps involved in forming partially fabricated IC 10 of FIG. 1 include blanket depositing a first dielectric layer 12, such as silicon dioxide ($SiO_2$), atop substrate layer 16. After first dielectric layer 12 is planarized, a masking layer (not shown), which typically includes photoresist, is blanket deposited over first dielectric layer 12 and patterned by conventional photolithography. Next, the unmasked portions of first dielectric layer 12 are etched to form a contact hole that provides an opening to the underlying device elements, e.g., source, drain and gate electrode, in substrate layer 16.

At this point, the partially fabricated IC is drenched in a bath of post-etch cleaning solution, which removes the etch residue present at the side-walls of the contact hole. Post-etch cleaning solutions may include amine based compounds, which are believed to be the active ingredient for cleaning the contact hole. By way of example, a post-etch cleaning solution EKC265™ obtained from EKC Technology Inc. of Hayward, Calif. includes hydroxylamine that is believed to be primarily responsible for removing the etch-residue from the contact hole. Other ingredients of EKC265™ include 2-(2-Aminoethoxy)Ethanol and Catechol.

After the post-etch cleaning process has concluded, an adhesion layer (not shown to simplify illustration), e.g., a titanium layer, a barrier layer (not shown to simplify illustration), e.g., a titanium nitride layer, and a tungsten layer are blanket deposited on the partially fabricated IC, filling the contact hole. The surface of the partially fabricated IC typically then undergoes chemical-mechanical polishing to form contact plug 14.

A metallization layer 18 is then blanket deposited and patterned over dielectric layer 12 such that metallization layer 18 partially covers contact plug 14. Next, a second dielectric layer 20 is deposited over the surface of the partially fabricated IC. A via (hereinafter referred to as "via hole" to distinguish from "via plug," explained below) is etched into second dielectric layer 20 by conventional, during which the location of via hole typically misregisters and hangs to one side of metallization layer 18. Furthermore, at this location it is well known in the art that the dielectric layer frequently over etches, as shown in FIG. 1, and forms an opening 24 between metallization 18 and second dielectric layer 20 that extends all the way down to contact plug 14.

Those skilled in the art will recognize that depositing metallization layer 18 in a dogbone formation to prevent the formation of opening 24 is undesired because metallization in dogbone formation consumes significantly larger area on the substrate surface and thereby reduces the number of die formed on a semiconductor wafer.

Via hole 22 then undergoes post-etch cleaning using the post-etch cleaning solution, as described above, to remove the etch residue present at the side-walls of the via hole. Next, an adhesion layer, a barrier layer and a tungsten layer may be deposited on the partially fabricated IC surface and undergo chemical-mechanical polishing to form a via plug, which connects one metallization layer to another metallization layer of an IC.

Unfortunately, the above described process suffers from several drawbacks. By way of example, some of the post-etch cleaning solution composition may remain in the contact hole and via hole, corroding the metal plug, i.e. contact or via plug, formed subsequently. The metal plug, therefore, does not effectively connect the device elements to the first metallization layer or connect one metallization layer to another metallization layer, causing catastrophic device failure.

As another example, during post-etch cleaning of the via hole, opening 24 between the metallization layer 18 and dielectric layer 20 provides the post-etch cleaning solution a pathway to migrate or seep into the underlying contact plug. As a result, the metal, e.g., tungsten, composition in the contact plug reacts with the post-etch cleaning solution and is depleted and/or corroded, which may also lead to catastrophic device failure.

What is therefore needed is an improved post-etch cleaning process, which effectively removes post-etch residue and inhibits corrosion of the IC.

SUMMARY OF THE INVENTION

To achieve the foregoing, the present invention provides a corrosion inhibiting cleaning process for removing etch-residue from an integrated circuit substrate. The corrosion inhibiting cleaning process includes: (1) obtaining an integrated circuit substrate that has undergone etching; and (2) cleaning the integrated circuit substrate using a post-etch cleaning solution including a corrosion inhibiting agent in a sufficient concentration to effectively inhibit corrosion of the integrated circuit substrate.

According to one embodiment, the step of obtaining the integrated circuit substrate includes etching a dielectric layer of the integrated circuit substrate to form a contact hole or a via hole. In an alternative embodiment, the step of etching includes forming a via hole that extends down through the dielectric layer and between the dielectric layer and a metallization layer disposed below the dielectric layer such that the via hole hangs to one side of the metallization layer and provides the post-etch cleaning solution access to a contact plug disposed below the metallization layer.

The step of cleaning may include drenching the integrated circuit in the post-etch cleaning solution. The post-etch cleaning solution may include an amine-based compound and at least one of a sulfur containing compound, a phosphorus containing compound and an azole. In a preferred embodiment, the corrosion inhibiting compound of the present invention includes a thiazole compound and/or a triazole compound. The concentration of the corrosion inhibiting compound in the post-etch cleaning solution may generally range from between about 0.0001% (in volume) to a value that is limited by the solubility of the corrosion inhibiting compound in the cleaning solution.

The post-etch cleaning process of the present invention further includes rinsing the integrated circuit substrate with deionized water. In a preferred embodiment, however, the post-etch cleaning process further includes rinsing the integrated circuit substrate with a rinsing composition that has deionized water and at least one of a sulfur containing compound, a phosphorus containing compound and an azole.

In another aspect, the present invention provides a corrosion inhibiting post-etch cleaning composition. The corrosion inhibiting post-etch cleaning composition includes: (1) a cleaning agent for effectively removing the etch-residue from an integrated circuit substrate; and (2) a corrosion inhibiting agent in effective an amount to inhibit corrosion of a metal plug in an integrated circuit.

The cleaning agent may include an amine based compound, e.g., hydroxylamine, and 2-(2-Aminoethoxy) Ethanol and Catechol. The corrosion inhibiting agent may include at least one compound selected from the group consisting of a sulfur containing compound, a phosphorus containing compound and an azole. The phosphorus containing compound may include at least one compound selected from the group consisting of acetodisphosphonic acid, nitrilog tris methylene phosphonic acid and methylamino dimethylene phosphonic acid and hydroxyethylidene diphosphonic acid. The sulfur containing compound may include at least one compound selected from the group consisting of zinc sulfate, calcium sulfonate, magnesium sulfate heptahydrate and sulfonated styrene. The azole compound may include at least one compound selected from the group consisting of triazoles, pyrazoles, imidazoles, isoxazoles, oxazoles, isothiazoles, and thiazoles. The corrosion inhibiting compound of the present invention may include at least one of 2-mercaptothiazole, 2-mercaptobenzothiazole, benzothiazole, benzotriazole, and tolytriazole.

The effective amount of corrosion inhibiting agent in the post-etch cleaning solution may range from about 0.001% (in volume) to a value that is limited by the solubility of the corrosion inhibiting agent in the post-etch cleaning solution. In a preferred embodiment, however, the effective amount of corrosion inhibiting agent in the post-etch cleaning solution is between about 0.001% (in volume) and about 2% (in volume).

In another aspect, the present invention provides a rinsing composition for rinsing an integrated circuit substrate that has undergone etching. The rinsing composition includes: (1) a rinsing agent to effectively wet the integrated circuit substrate; and (2) a corrosion inhibiting agent in an effective amount to inhibit corrosion of the integrated circuit.

The rinsing agent may include deionized water and the corrosion inhibiting agent may include at least one compound selected from the group consisting of a sulfur containing compound, a phosphorus containing compound and an azole. The phosphorus containing compound may include at least one compound selected from the group consisting of acetodisphosphonic acid, nitrilog tris methylene phosphonic acid and methylamino dimethylene phosphonic acid and hydroxyethylidene diphosphonic acid. The sulfur containing compound may include at least one compound selected from the group consisting of zinc sulfate, calcium sulfonate, magnesium sulfate heptahydrate and sulfonated styrene. The azole compound may include at least one compound selected from the group consisting of triazoles, pyrazoles, imidazoles, isoxazoles, oxazoles, isothiazoles, and thiazoles. the corrosion inhibiting agent includes at least one of 2-mercaptothiazole, 2-mercaptobenzothiazole, benzothiazole, benzotriazole, and tolytriazole.

The effective amount of the corrosion inhibiting agent in the rinsing solution may generally range from about 0.001% (in volume) to a value that is limited by the solubility of the corrosion inhibiting agent in the rinsing solution. In a preferred embodiment, however, the effective amount of corrosion inhibiting agent in the rinsing solution is between about 0.001% (in volume) and about 2% (in volume). The rinsing composition of the present invention may inhibit corrosion of metal plugs in the integrated circuit.

These and other features of the present invention will be described in more detail below in the detailed description of the invention and in conjunction with the following Figures.

DETAILED DESCRIPTION OF THE PREFERRED EMBODIMENTS

The present invention provides post-etching cleaning processes and compositions for inhibiting corrosion in integrated circuits (ICs). In the following description, numerous specific details are set forth in order to fully illustrate a preferred embodiment of the present invention. It will be apparent, however, that the present invention may be practiced without limitation to some specific details presented herein. By way of example, the contact plug 14 of FIG. 1 or via plug, as described above, may be filled with other metals or conductive materials, besides tungsten, such as aluminum and copper.

Figure 1:
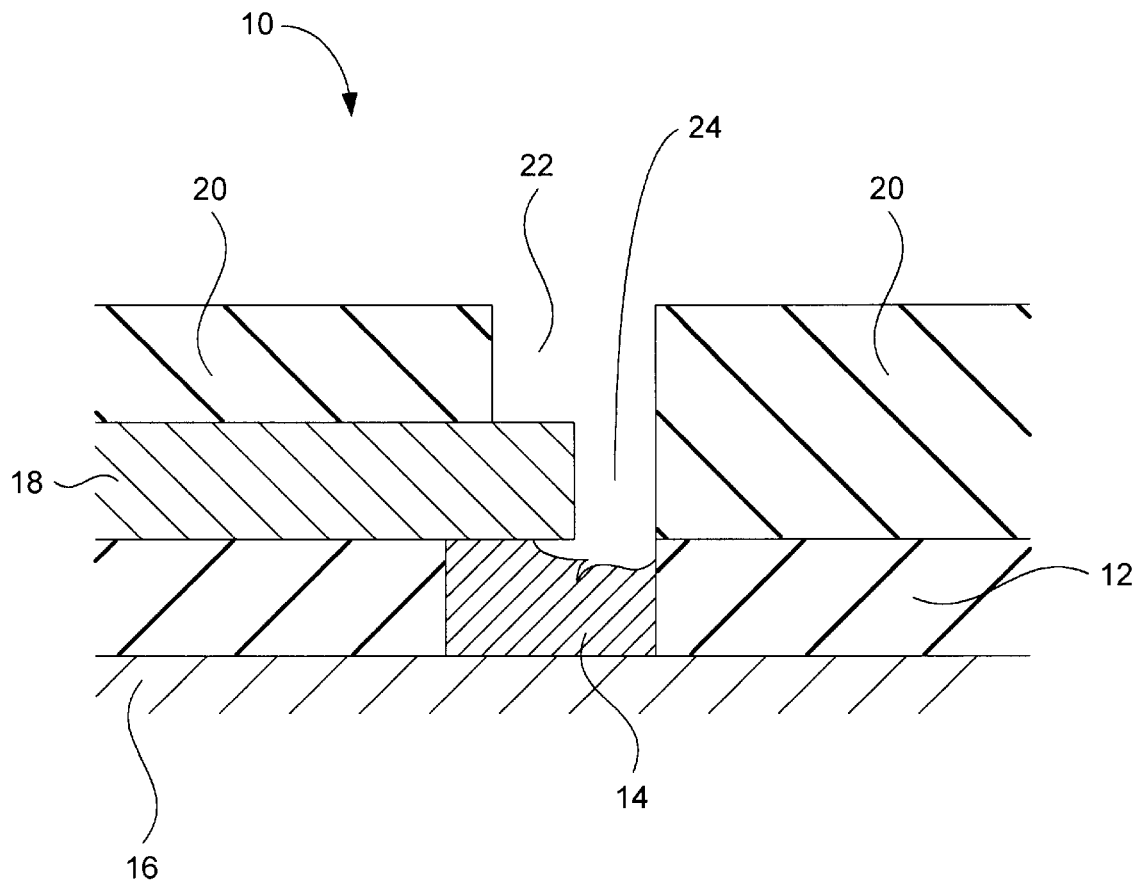
FIG. 1 shows a cross-sectional view of a partially fabricated integrated circuit (IC) that undergoes corrosion due to the current post-etch cleaning processes.
Figure 2:
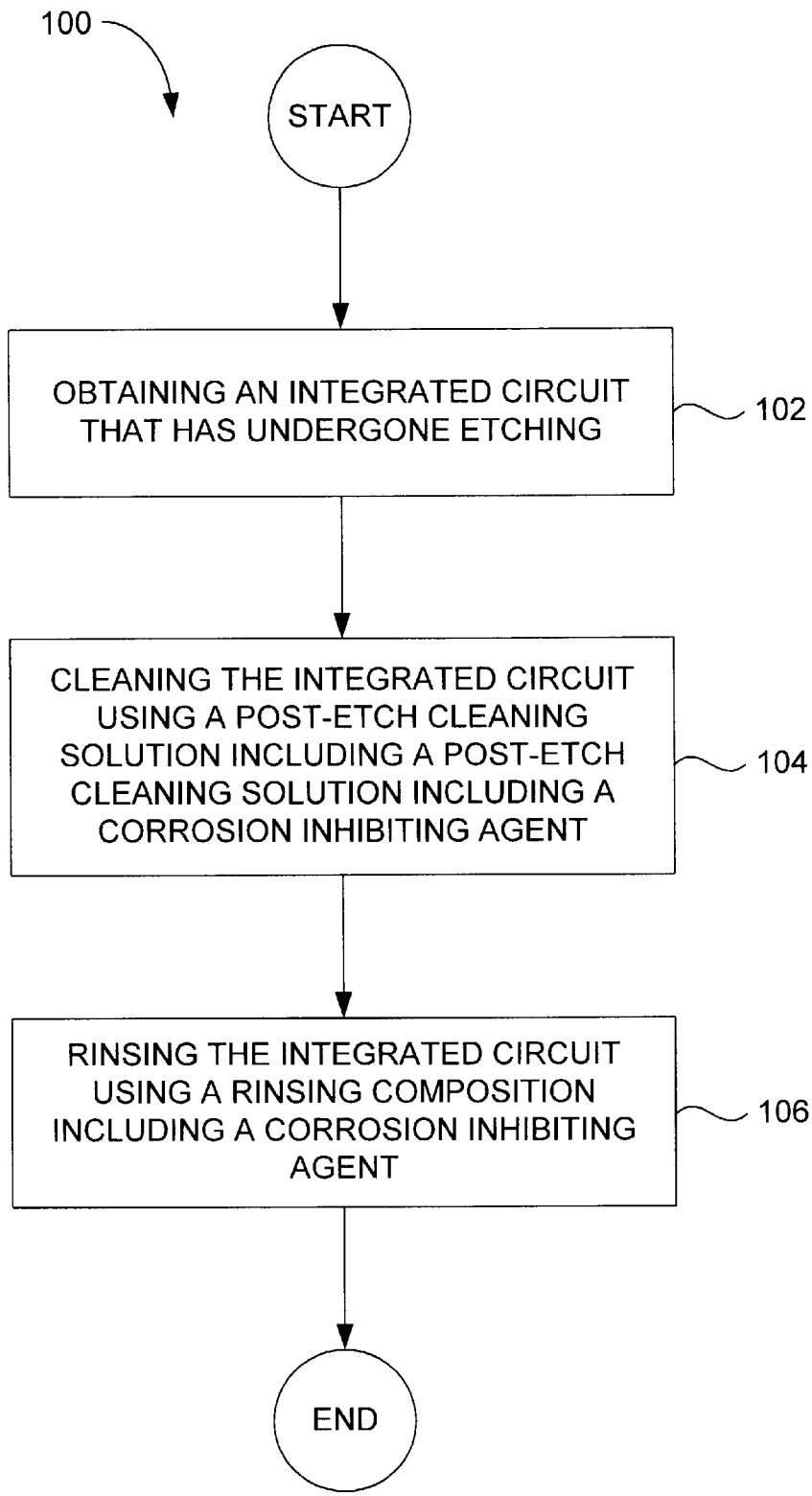
FIG. 2 shows a flowchart of a corrosion inhibiting post-etch cleaning process, according to one embodiment of the present invention.

FIG. 2 shows a flowchart of a corrosion inhibiting post-etch cleaning process 100, according to one embodiment of the present invention. Process 100 begins at a step 102, which includes obtaining an integrated circuit (IC) that has undergone etching. In one embodiment of the present invention, in step 102, a first dielectric layer disposed directly above a substrate layer is etched to form a contact hole, as described above. In an alternative embodiment, the IC undergoes etching to form via hole 22, as shown in FIG. 1 (absent the corrosion of the contact plug). In yet another embodiment, step 102 is carried out by etching a second dielectric layer to form a via hole that does not misregister and therefore does not hang off to one side of a metallization layer. In this embodiment, therefore, there is no opening 24 as shown in FIG. 1.

Next, a step 104 includes cleaning the IC obtained in step 102 using a post-etch cleaning solution that has a corrosion inhibiting agent. According to one embodiment of the present invention, step 104 is carried out by immersing the IC of step 102 into a reservoir of post-etch cleaning solution. Step 104, in an another embodiment, is implemented by introducing the post-etch cleaning solution on the IC in sufficient amounts to drench the IC with the post-etch cleaning solution. Regardless of how step 104 is carried out, step 104 has the effect of removing the etch-residue that accumulates or is deposited on the dielectric layer side-walls of the contact or via hole during etching and inhibiting corrosion of the IC.

The corrosion inhibiting post-etch cleaning composition employed in step 104 includes a corrosion inhibiting agent admixed with the conventional post-etch cleaning solution. By way of example, the corrosion inhibiting post-etch cleaning composition, according to one embodiment of the present invention, may include an amine based compound and a corrosion inhibiting agent, which includes at least one of a phosphorous containing compound, a sulfur containing compound and an azole.

By way of example, representative sulfur containing compounds include zinc sulfate, calcium sulfonate, magnesium sulfate heptahydrate, sulfonated styrene, etc. Representative phosphorous containing compounds include acetodisphosphonic acid, nitrilo tris methylene phosphonic acid and methylamino dimethylene phosphonic acid, hydroxyethylidene diphosphonic acid, etc. Representative azole compounds include triazoles, pyrazoles, imidazole, isoxazoles, oxazoles, isothiazoles and thiazoles. In a preferred embodiment, however, the corrosion inhibiting agent of the present invention is a thiazole or a triazole compound. Suitable thiazoles include thiazole itself, 2-mercaptothiazole, 2-mercaptobenzothiazole, benzothiazole, etc. Suitable triazoles include triazole itself, benzotriazole, tolyltriazole, etc. The above list of compounds should not be construed as an exhaustive list and those skilled in the art will recognize that other compounds, such as chromates may be used as corrosion inhibiting agents of the present invention. Furthermore, the corrosion inhibiting compounds may also contain any combination of the above mentioned compounds.

According to one embodiment, process 100 may conclude when the IC after undergoing cleaning as described in step 104 is rinsed using a rinsing solution that primarily includes deionized water. In a preferred embodiment, however, an optional step 106 includes rinsing the IC with a rinsing composition that includes a corrosion inhibiting agent, which may be a compound mentioned above in step 104. In the preferred embodiment, therefore, after the IC is cleaned with a corrosion inhibiting post-etch cleaning composition, the IC is then rinsed with a corrosion inhibiting rinsing composition.

The corrosion inhibiting agents of the present invention may be present in effective amounts in the post-etch cleaning solutions or rinsing solutions, which are referred to as "liquid solutions or mixtures" hereinafter, to effectively inhibit corrosion of the IC, particularly contact or via hole or metal plugs in an IC. The concentration of the corrosion inhibiting compound(s) present in these liquid solutions or mixtures may generally range from a lower limit of about 0.0001% (in volume) to a value that is limited by the solubility of the corrosion inhibiting compound in the liquid solutions or mixtures. The concentration of the corrosion inhibiting compound in the above mentioned liquid solutions or mixtures may preferably be between about 0.001% and about 2% (in volume). By way of example, the corrosion inhibiting post-etch cleaning solution may include benzotriazole that is between about 0.0001% (in volume) to a value that is limited by the solubility of benzotriazole in the post-etch cleaning composition.

It is important to note that current post-etch cleaning solutions are employed to dissolve metal compounds present as etch-residue on the etched dielectric layer sidewalls, but these cleaning solutions also undesirably dissolve the metal plug composition. Inclusion of any known corrosion inhibiting agent into the post-cleaning solution for inhibiting metal plug corrosion runs the risk of not effectively dissolving the metal compounds of the etch-residue. The corrosion inhibiting post-cleaning composition, according to the present invention, however, effectively dissolves the metal compounds present as the etch-residue, without dissolving the metal plug composition.

Although the foregoing invention has been described in some detail for purposes of clarity of understanding, it will be apparent that certain changes and modifications may be practiced within the scope of the appended claims. For example, while the specification describes introducing the corrosion inhibiting compound during post-etch cleaning and rinsing steps, there is no reason why in principle the corrosion inhibiting compound of the present invention cannot be introduced in other IC cleaning operations. Therefore, the present embodiments are to be considered as illustrative and not restrictive, and the invention is not to be limited to the details given herein, but may be modified within the scope of the appended claims.

What is claimed is:

1. A corrosion inhibiting cleaning process for removing etch-residue from an integrated circuit substrate, comprising:

cleaning an integrated circuit substrate that has undergone etching using a post-etch cleaning solution including a corrosion inhibiting agent in a sufficient concentration to effectively inhibit corrosion of said integrated circuit, wherein the post etch cleaning solution dissolves metal etch residue and inhibits corrosion of said integrated circuit substrate, and wherein the corrosion inhibiting agent includes at least one of a sulfur containing compound, a phosphorus containing compound and an azole.

2. The process of claim 1, wherein said integrated circuit substrate has undergone etching of a dielectric layer of said integrated circuit substrate to form a contact hole or a via hole.

3. The process of claim 1, wherein said integrated circuit substrate has undergone etching to form a via hole that extends down through said dielectric layer and between said dielectric layer and a metallization layer disposed below said dielectric layer such that the via hole hangs to one side of said metallization layer and provides the post-etch cleaning solution access to a contact plug disposed below said metallization layer.

4. The process of claim 1, wherein said cleaning includes drenching the integrated circuit in the post-etch cleaning solution.

5. The process of claim 1, wherein the post-etch cleaning solution includes an amine-based compound.

6. The process of claim 1, wherein the corrosion inhibiting agent includes at least one of a thiazole compound and a triazole compound.

7. The process of claim 1, wherein the concentration of the corrosion inhibiting agent in the post-etch cleaning solution ranges from between about 0.0001% (in volume) to a value that is limited by the solubility of the corrosion inhibiting agent in the cleaning solution at operating conditions.

8. The process of claim 1, further comprising rinsing the integrated circuit substrate with deionized water.

9. The process of claim 1, further comprising rinsing the integrated circuit substrate with a rinsing composition that includes deionized water and at least one of a sulfur containing compound, a phosphorus containing compound and an azole.

10. The process of claim 1, wherein said post-etch cleaning solution includes hydroxylamine.

11. The process of claim 1, wherein said post-etch cleaning solution includes at least one of 2-(2-Aminoethoxy) Ethanol and Catechol.

12. The process of claim 1, wherein the phosphorus containing compound includes at least one compound selected from the group consisting of acetodisphosphonic acid, nitrilo tris methylene phosphonic acid and methylamino dimethylene phosphonic acid and hydroxyethylidene diphosphonic acid.

13. The process of claim 1, wherein the sulfur containing compound includes at least one compound selected from the group consisting of zinc sulfate, calcium sulfonate, magnesium sulfate heptahydrate and sulfonated styrene.

14. The process of claim 1, wherein the azole compound includes at least one compound selected from the group consisting of triazoles, pyrazoles, imidazoles, isoxazoles, oxazoles, isothiazoles, and thiazoles.

15. The process of claim 1, wherein the corrosion inhibiting agent includes at least one of 2-mercaptothiazole, 2-mercaptobenzothiazole, benzothiazole, benzotriazole and tolytriazole.

16. The process of claim 1, wherein the effective amount of corrosion inhibiting agent in the post-etch cleaning solution is between about 0.001% (in volume) and about 2% (in volume).

* * * * *